United States Patent
Becker et al.

[11] Patent Number: 6,015,760
[45] Date of Patent: Jan. 18, 2000

[54] METHOD FOR ENHANCING OXIDE TO NITRIDE SELECTIVITY THROUGH THE USE OF INDEPENDENT HEAT CONTROL

[75] Inventors: David S. Becker; Guy T. Blalock, both of Boise, Id.; Fred L. Roe, San Jose, Calif.

[73] Assignee: Micron Technology, Inc., Boise, Id.

[21] Appl. No.: 08/905,891

[22] Filed: Aug. 4, 1997

Related U.S. Application Data

[63] Continuation of application No. 08/152,755, Nov. 15, 1993, Pat. No. 5,880,036, which is a continuation-in-part of application No. 07/898,505, Jun. 15, 1992, Pat. No. 5,286,344.

[51] Int. Cl.⁷ .................................................. H01L 21/302
[52] U.S. Cl. .......................... 438/714; 438/715; 438/723; 438/724; 438/740
[58] Field of Search .................................. 438/723, 724, 438/715, 714, 740

[56] References Cited

U.S. PATENT DOCUMENTS

| | | | |
|---|---|---|---|
| 3,479,237 | 11/1969 | Bergh et al. | 156/11 |
| 4,180,432 | 12/1979 | Clark | 156/643 |
| 4,241,165 | 12/1980 | Hughes et al. | 430/269 |
| 4,244,752 | 1/1981 | Henderson et al. | 148/1.5 |
| 4,324,611 | 4/1982 | Vogel et al. | 156/643 |
| 4,374,698 | 2/1983 | Sanders et al. | 156/643 |
| 4,439,270 | 3/1984 | Powell et al. | 156/644 |
| 4,568,410 | 2/1986 | Thornquist | 156/643 |
| 4,581,101 | 4/1986 | Senoue et al. | 156/643 |
| 4,734,152 | 3/1988 | Geis et al. | 156/657 |
| 4,734,157 | 3/1988 | Carbaugh et al. | 156/643 |
| 4,789,560 | 12/1988 | Yen | 427/96 |
| 4,870,245 | 9/1989 | Price et al. | 219/121.36 |
| 4,877,641 | 10/1989 | Dory | 427/38 |
| 4,892,753 | 1/1990 | Wang et al. | 427/38 |
| 4,912,061 | 3/1990 | Nasr | 437/44 |
| 4,971,655 | 11/1990 | Stefano et al. | 156/659.1 |
| 4,978,420 | 12/1990 | Bach | 156/643 |
| 5,013,398 | 5/1991 | Long et al. | 156/643 |
| 5,013,692 | 5/1991 | Ide et al. | 437/241 |
| 5,021,121 | 6/1991 | Groechel et al. | 156/643 |
| 5,040,046 | 8/1991 | Chhabra et al. | 357/54 |
| 5,043,790 | 8/1991 | Butler | 357/68 |
| 5,093,277 | 3/1992 | Arima et al. | 437/69 |
| 5,242,538 | 9/1993 | Hamrah et al. | 156/643 |
| 5,286,344 | 2/1994 | Blalock et al. | 156/657.1 |
| 5,316,616 | 5/1994 | Nakamura et al. | 156/643 |
| 5,338,398 | 8/1994 | Szwejkowski et al. | 156/655 |
| 5,376,233 | 12/1994 | Man | 156/662 |
| 5,423,945 | 6/1995 | Marks et al. | 156/662.1 |
| 5,451,290 | 9/1995 | Salfelder | 216/67 |
| 5,470,768 | 11/1995 | Yanai et al. | 437/40 |
| 5,477,975 | 12/1995 | Rice et al. | 156/345 |
| 5,556,501 | 9/1996 | Collins et al. | 156/345 |

FOREIGN PATENT DOCUMENTS

| | | |
|---|---|---|
| 651434 | 5/1995 | European Pat. Off. . |
| 58-53833 | 3/1983 | Japan . |
| 1-15930 | 1/1989 | Japan . |
| 2-62038 | 3/1990 | Japan . |
| 4-180222 | 6/1992 | Japan . |
| 4-298032 | 10/1992 | Japan . |

OTHER PUBLICATIONS

"Crown–Shaped Capacitor Cell for 1.5 V. Operations 64 MbDRAMS" (Toru Kaga, et al.) IEEE Transactions on Electron Devices, vol. 38, No. 2, Feb. 1991.

"VLSI Device Fabrication A Using Unique, Highly–selective Si3N4 Dry Etching" (T. Kur et al) Proceeding of the International Electron Devices Meeting (IEDM), 1983, pp. 757–759.

(List continued on next page.)

*Primary Examiner*—William Powell
*Assistant Examiner*—George Goudreau

[57] ABSTRACT

A process for controlling the etch of a silicon dioxide layer at a high etch rate and high selectivity with respect to silicon nitride, particularly in a multilayer structure, by maintaining various portions of the etch chamber at elevated temperatures.

24 Claims, 3 Drawing Sheets

OTHER PUBLICATIONS

"Formation of Contacts in a Planarized SiO2/Si3N4/SiO2 Dielectric Structure" (Paul E. Riley, Konrad K. Yound, and Charles C. Liu) J. Electrochem Soc. vol. 139. No. 9. Sep. 1992.

"A Method of Obtaining High Oxide to Nitride Selectivity in a Menle Reactor," by Becker, Blalock to be presented at the spring Electrochemical Society Meeting, May 1993.

"Selective Oxide: Nitride Dry Etching in a High Density Plama Reactor" by M. Armocost, J. Marks, May 1993.

"Self–Aligned Bitline Contact for 4 Mbit Dram", K. H. Kuesters, H.M. Mueklhoff, G. Enders, E.G. Mohr, W. Mueller, pp. 640–649, Int. Symposium on Ultra Large Scale Integrated Sci. Tech. 1987.

"A Buried–Plate Trench Cell for a 64–Mb Dram", Kenney et al., 1992 Symposium of VLSI Technology Digest of Technical paper, pp. 14–15, 1992.

"Gas Mixing to Prevent Polymer Formation during Reactive Ion Etching", J.A. Bondur and C.F. Crimi, IBM Technical Disclosure Bulletin, vol. 21, No. 10, Mar. 1979.

"Self Aligned Contact Development Activity Increases Aimed for Large Scale Manufacturing Around 0.25 Mm Era Problem of Etching Technology: Improvemnt of Si3N4 Selectivity ratio", LSI Interconnect Tech. Etching, Nikkei Microdevices, pp. 54–61, Feb. 1995.

"Developments in Plasma Processing" R.A. Gottscho, AT&T Bell Labs, 1994 American Vacuum Society Symposium, p. 120.

"Selective ething of silicon nitride using remote plasmas of CF4 and SF6," Lee M. Loewenstein, J.Vac. Sci. Technol. vol. 7, No. 3, pp. 686–690, May/Jun. 1989.

"Temperature dependence of silicon nitride etching by atomic fluorine," Lee M. Loewenstein, J. Appl. Phys., vol. 65, No.1,pp. 386–387, Jan. 1, 1989.

"Self–Aligned Contact (SAC) Dry Etch Process for 0.5u SRAM Technology", J.E. Nulty, P.S. Trammel, Cypress Semiconductor, 1994 American Vacuum Society Symposium, p. 120.

METHOD FOR ENHANCING OXIDE TO NITRIDE SELECTIVITY THROUGH THE USE OF INDEPENDENT HEAT CONTROL

CROSS-REFERENCE TO RELATED APPLICATIONS

This is a continuation application of U.S. application Ser. No. 08/152,755, filed Nov. 15, 1993, and now U.S. Pat. No. 5,880,036; which was a continuation-in-part of application Ser. No. 07/898,505, filed Jun. 15, 1992, which issued as U.S. Pat. No. 5,286,344 on Feb. 15, 1994.

FIELD OF THE INVENTION

This invention relates to semiconductor manufacturing, and more particularly to a process for selectively etching a silicon dioxide layer disposed on a silicon nitride layer, useful when etching features have submicron geometries.

BACKGROUND OF THE INVENTION

With geometries shrinking, it is becoming more difficult to align small contacts in between closely spaced wordlines or other conductive structures. Therefore, an etch is needed which would etch an oxide layer and stop on the underlying nitride layer. The highly selective etch should also display consistency for manufacturing purposes.

Current manufacturing processes of multilayer structures typically involve patterned etching of areas of the semiconductor surface which are not covered by a pattern of protective photoresist material. These etching techniques use liquid or wet etching materials, or dry etching with halogens or halogen-containing compounds.

Etching of the multilayer structures can also be conducted in a gas phase using known techniques, such as plasma etching, ion beam etching, and reactive ion etching. The use of gas plasma technology provides substantially anisotropic etching using gaseous ions, typically generated by a radio frequency (RF) discharge.

In gas plasma etching the requisite portion of the surface to be etched is removed by a chemical reaction between the gaseous ions and the subject surface. In the anisotropic process, etching takes place primarily in the vertical direction so that feature widths substantially match the photoresist pattern widths. Anisotropic etching is utilized when feature sizing after etching must be maintained within specific limits so as not to violate alignment tolerances or design rules.

Higher density multilayer structures such as 64 and 256 Megabit DRAM require an additional amount of alignment tolerance which can not be addressed by current photolithographic means. In such applications, an etch stop technology could be used to supply the desired tolerance.

In an etch "stop" system, an etch "stop" layer is deposited on underlying structures. The superjacent layer is disposed over the underlying etch "stop" layer through which the desired patterns will be defined. The etch "stop" layer will then be used to terminate the etch process once the superjacent layer has been completely removed in the desired pattern locations. Thus, the etch "stop" layer acts to protect structures underlying the etch "stop" layer from damage due to the dry chemical etch of the superjacent layer.

The preferred etch "stop" material is silicon nitride because its properties are well known, and it is currently used for semiconductor fabrication. The preferred superjacent layer is silicon dioxide, or other oxide such as, BPSG.

The etch stop process must have three basic properties, namely, (1) a high etch rate for the superjacent layer which (2) produces substantially vertical sidewalls, and (3) has a high selectivity of the superjacent layer being etched down to the etch "stop" layer.

A problem of profile control occurs with respect to etching of a multilayer structure having a silicon dioxide layer disposed on an underlying silicon nitride layer. Profile control using pure chemical etching (e.g., using hydrofluoric acid) tends to produce structures that do not have vertical sidewalls.

Dry etch processing usually produces a more vertical profile because of the ion bombardment aspect of the process. However, the dry etch process can produce a contact wall that slopes out from the bottom, rather than at an angle of 90°, if the wrong mix of process parameters are used. These parameters can include, but are not limited to; fluorocarbon, RF power, and pressure.

The same ion bombardment aspect of the dry etch process used to produce straight sidewalls has a very negative effect on oxide to nitride selectivity. High energy ions needed to etch both oxide and nitride do so by disassociating a chemical bond at the oxide and/or nitride surface. However, the disassociation energy needed for nitride is less than that required for oxide.

Hence, $CH_2F_2$ is added to offset the disassociation properties of nitride as compared to oxide. The $CH_2F_2$ produces a polymer deposition on the nitride surface that acts to passivate the nitride surface and thereby reduce the dry etch removal rate. However, the silicon dioxide etch rate is sustained at a much higher rate than that of silicon nitride.

Current etch process technology for etching an $SiO_2$ layer on an underlying $Si_3N_4$ layer using a dry etcher, such as an RIE or MRIE etcher, cannot produce $SiO_2$-to-$Si_3N_4$ selectivities above 5–6:1 with adequate profile and $SiO_2$ etch rate characteristics.

Almost all of the current etch processes which involve high selective etches, rely on cooler temperatures to obtain those selectivities. See, for example, "Temperature Dependence of Silicon Nitride Etching by Atomic Fluorine," and "Selective Etching of Silicon Nitride Using Remote Plasmas of $CF_4$ and $SF_6$," both by Lee M. Loewenstein. The latter reference uses an Arrhenius plot having a negative slope to illustrate that the nitride etch rate increases as a function of substrate temperature.

Therefore, a need exists for a process of etching a $SiO_2$ layer on an underlying $Si_3N_4$ layer, at a high $SiO_2$ etch rate. Furthermore, there exists a need for an etch at a high selectivity of $SiO_2$ with respect to the underlying $Si_3N_4$, to form an etched multilayer structure at a controlled predetermined profile in which the resulting sidewalls are substantially normal to the substrate.

SUMMARY OF THE INVENTION

The present invention provides unexpected and very key improvements over the current etch processes. The present invention teaches away from current thought, by using increased temperatures to achieve increased selectivity. In addition to improved selectivity, the higher temperatures help reduce the polymer build-up inside the chamber.

The process of the present invention meets the above-described existing needs by forming an etched multilayer structure, in which the sidewalls of the $SiO_2$ layer are substantially normal to the substrate, at a high $SiO_2$ etch rate, and at a high selectivity of $SiO_2$ with respect to the underlying $Si_3N_4$. This is accomplished by heating various portions of the etch chamber while employing a process for etching the $SiO_2$ layer down to the $Si_3N_4$ stop layer.

BRIEF DESCRIPTION OF THE DRAWINGS

The present invention will be better understood from reading the following description of nonlimitative embodiments, with reference to the attached drawings, wherein below.

DETAILED DESCRIPTION OF A PREFERRED EMBODIMENT

The inventive process herein is directed towards anisotropically etching a multilayer structure comprising a silicon dioxide outer layer on an underlying silicon nitride "stop" layer.

Figure 1:
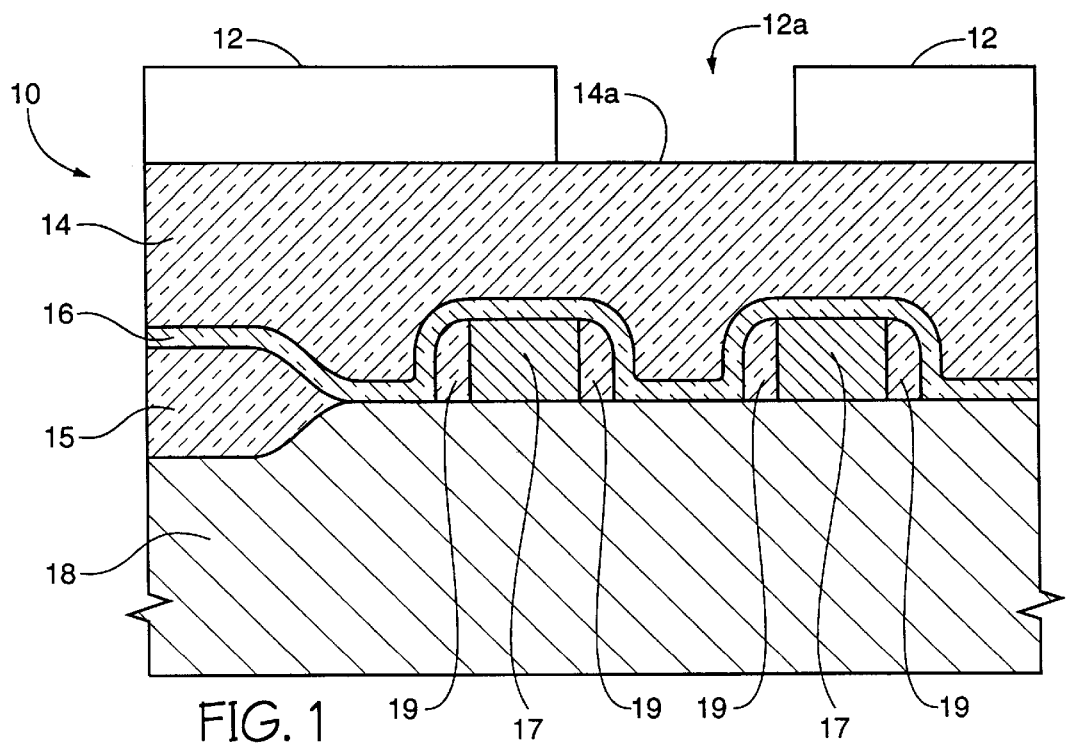
FIG. 1 is a schematic cross-section of a multilayer structure having a silicon dioxide layer disposed on a silicon nitride "etch" stop layer, prior to etching with the fluorinated chemical etchant system of the present invention.

Referring to FIG. 1, a multilayer structure, which is formed by conventional techniques, is depicted. It will serve as a representative example. The multilayer structure of FIG. 1, generally designated as 10, is shown prior to etching.

The multilayer structure 10 comprises a plurality of structural layers which are sequentially disposed on an underlying silicon structure or wafer 18. Multilayer structure 10 comprises a plurality of structural layers including a layer 14 having a major outer surface 14a. Structural layer 14 is fabricated of $SiO_2$.

Generally, an undoped oxide 15, referred to as a field oxide or gate oxide, is usually grown in a furnace. Doped oxide includes BPSG, PSG, etc. which are generally deposited on the silicon wafer with a dopant gas(es) during a deposition process.

The outer structural layer 14 is deposited onto an adjacent intermediate structural layer 16. Layer 16 includes sidewalls and is fabricated of an etch "stop" layer of silicon nitride.

Also shown in FIG. 1, is a chemical etchant protective patterned layer 12 which comprises a photoresist layer having a predetermined arrangement of openings 12a for forming a predetermined pattern in multilayer structure 10. Typically, this is accomplished using a semiconductor photomask, and known conventional etch mask patterning techniques.

The etch "stop" layer 16 is disposed on the field oxide 15, silicon substrate 18, and onto a plurality of polysilicon lines 17 located adjacent to their respective sidewalls spacer elements 19.

Figure 2:
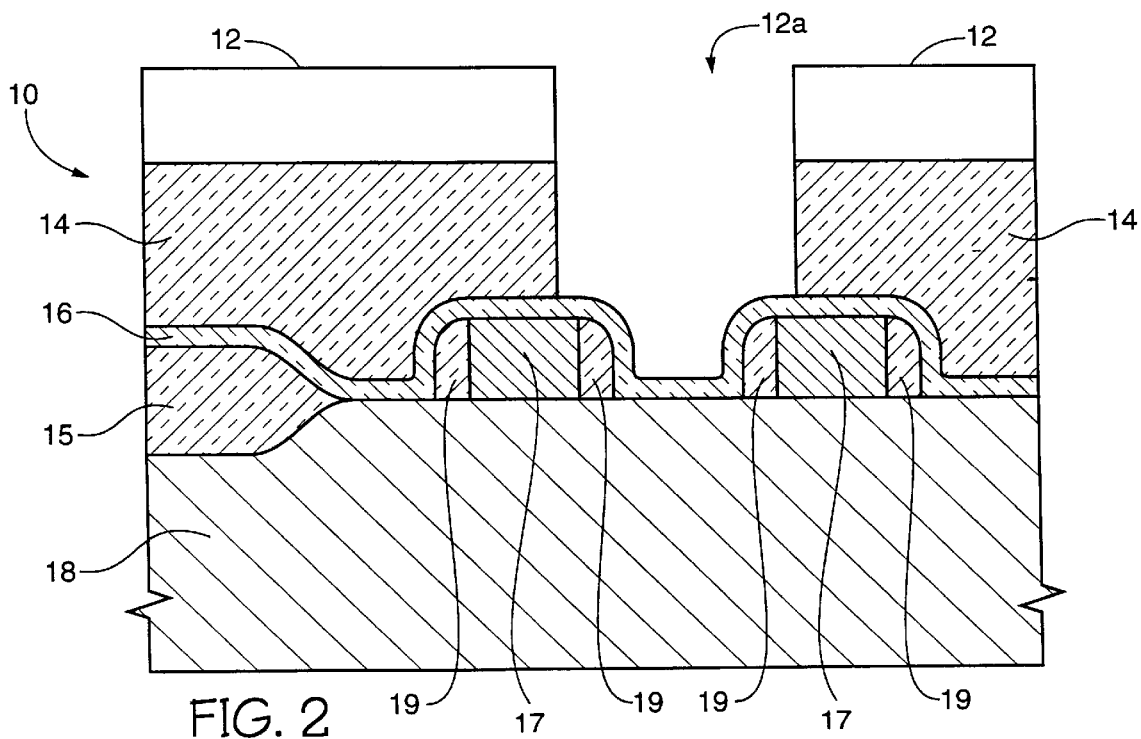
FIG. 2 is a schematic cross-section of the multilayer structure of FIG. 1, after the etch step according to the process of the present invention.

As seen in FIG. 2, the preferred manner of etching of the structural $SiO_2$ layer 14 down to etch "stop" layer 16 is by plasma etch. The gas plasma etch technique employed herein typically has an etching area in a plasma and is generated under vacuum within the confines of an RF discharge unit.

The preferred plasma etch technique employed herein may include the use of ECR (Electron Cyclotron Resonance), RIE, MIE, MERIE, PE reactive ion, point plasma etching, magnetically confined helicon and helical resonator, PE, or magnetron PE. In plasma dry etchers, typically the upper electrode is powered while the lower electrode is grounded.

In RIE (Reactive Ion Etchers), the lower electrode is powered while the upper electrode is grounded. In triode dry etchers, the upper and lower electrodes can be powered as well as the sidewall. In MERIE (magnetically enhanced reactive ion etch) magnets are used to increase the ion density of the plasma. In ECR (Electron Cyclotron Resonance), the plasma is generated upstream from the main reaction chamber. This produces a low ion energy to reduce damage to the wafer.

A semiconductor device is disposed in the desired etcher, within an etching area, and is etched with a fluorinated chemical etchant system to form a predetermined pattern therein. The fluorinated chemical etchant system comprises a chemical etchant composition, such as, for example, $CHF_3$—$CF_4$—Ar, and a $CH_2F_2$ additive material. The fluorinated chemical etchant system is in a substantially gas phase during the etching of the multilayer structure 10.

The exposed $SiO_2$ layer 14 is selectively etched at a relatively high etch rate down to the $Si_3N_4$ etch "stop" layer 16 by removing predetermined portions of the $SiO_2$ layer 14 by chemically enhanced ionic bombardment. Some areas of the wafer still had $SiO_2$ available for etching, while other areas of the wafer had already reached the nitride layer 16 where the etching process effectively stops because of polymer formation on the nitride surface. In this way, the etching process can provide for the formation of sidewalls in etched layers which have a substantially vertical profile.

The etching system employed in developing the process of this invention was the Applied Materials Precision 5000, a single wafer plasma etching apparatus manufactured by Applied Materials of Santa Clara, Calif. This apparatus comprises a mobile, double cassette platform, a transport chamber with an 8-wafer storage elevator, and from 1–4 plasma etching chambers.

The mobile cassette platform is maintained at atmospheric pressure during the entire operation of the apparatus. It holds two cassettes of wafers, each capable of holding up to 25 wafers. The platform can be raised or lowered and moved laterally so that any particular wafer may be aligned with a narrow door located between the platform and the transport chamber.

Nitrogen gas is fed through a flow control valve into the transport chamber to vent the chamber to atmosphere. A robot transfer arm in the transport chamber transfers wafers from the cassette on the mobile cassette platform to the storage elevator in the transport chamber.

The transport chamber is connected to a two stage evacuation pump which is used to evacuate the transport chamber and maintain it at a suitable pressure for transporting wafers from the elevator to the plasma etching chamber. This pressure was maintained at 75–125 mTorr.

The plasma etching chamber is connected to a turbo pump and the two stage pump which evacuates the chamber to a lower pressure than that of the transport chamber. This pressure is typically less than 10 mTorr.

When the transport chamber and the plasma etching chamber have reached suitable pressures for wafer transfer, the robot arm transfers a wafer from the wafer storage elevator to the plasma etch chamber.

The plasma etching chamber contains an upper, electrically grounded electrode which also serves as the chamber sidewalls, and a lower, RF powered electrode upon which the wafer is clamped during the plasma etch process, and a set of electromagnetic coils placed around the chamber sidewalls.

In one embodiment of the present invention, an etch chamber having an upper electrode (or anode) which is comprised of silicon is used. It is believed that the silicon scavenges the free fluorine from the reaction, and thereby substantially prevents the free fluorine from etching the nitride layer 16.

Figure 3:
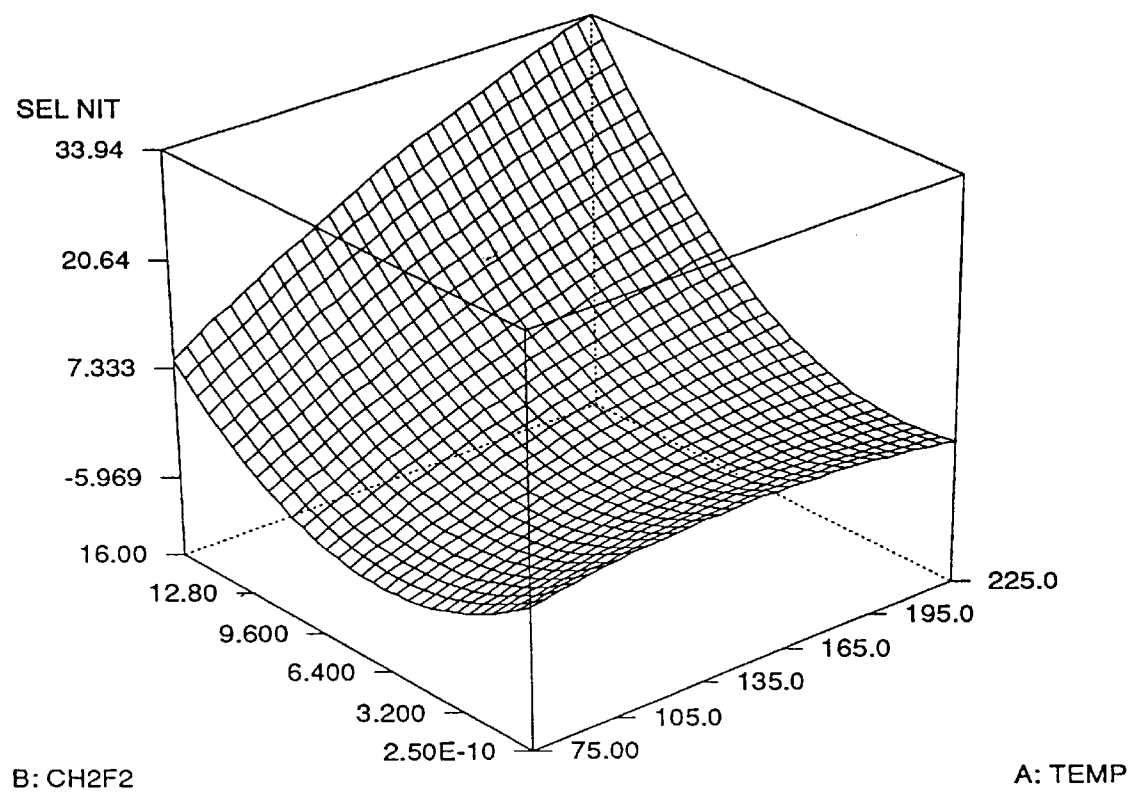
FIG. 3 is a plot of oxide:nitride selectivity in relation to both the silicon anode temperature and the addition of $CH_2F_2$.

In the process of the present invention, it has been unexpectedly found that an enhanced selectivity effect results with the addition of $CH_2F_2$ while using a hot silicon plate (or anode). For $CH_2F_2$ flows above 8 sccm, and silicon plate temperatures above 75° C., a significant result occurs, as depicted in plot of FIG. 3. At a silicon plate temperature of 225° C., the selectivity of oxide:nitride increases from 1.7:1 without $CH_2F_2$, to over 33:1 with the addition of 10 sccm The chamber also contains a gas distribution plate connected to the lid of the chamber, through which suitable feed gas mixtures are fed into the chamber from a connected gas supply manifold.

When RF energy is applied to the lower electrode, the gas fed into the chamber, via the gas distribution plate, is converted to plasma. The plasma contains reactive chemical species which etch selected unmasked portions of the wafer, which wafer is clamped to the lower electrode.

Electric power is applied to the electromagnetic coils which surround the chamber sidewalls. The magnetic field generated by the coils increases the density of the plasma near the wafer surface. A throttle valve located between the plasma etching chamber regulates the pressure of the chamber to processing values, generally in the range of 10–350 mTorr.

The lower electrode is connected to a wafer cooling system designed to maintain the wafer at a constant temperature during the plasma etch process. This system consists of two parts. The first is an apparatus providing a temperature controlled fluid which circulates through a tunnel in the lower electrode.

The second part is an apparatus providing a pressure and flow controlled inert gas (typically helium) of high thermal conductivity which is fed to the underside of wafer during etch via a channel through the lower electrode, opening to grooves on the top face of the lower electrode. The helium gas is contained behind the wafer by an O-ring seal which lies partially in a circular groove in the lower electrode.

The second part is referred to as a helium backside cooling system. During plasma etches, power is dissipated in the plasma through the ionization of the gaseous species. During the ionization process, a large amount of heat is generated. The helium backside cooling system allows the heat which has been imparted to the wafer, to be more effectively coupled to the temperature controlled lower electrode. As the pressure in the helium cooling system is increased, the wafer temperature more closely matches the temperature of the lower electrode throughout the plasma process. Hence, a more stable and predictable process is possible.

When the clamp is lowered to clamp the wafer against the lower electrode, the wafer underside is held tightly against the O-ring seal. The seal prohibits leakage of the inert gas from underneath the wafer to the plasma etch cavity.

The machine is governed by a programmable computer that is programmed to prompt the machine to evacuate and vent the transport chamber and plasma etching chamber, transfer wafers to and from the cassettes, elevator, and etch chamber, control the delivery of process gas, RF power, and magnetic field to the plasma etching chamber, and maintain the temperature of the wafer in the plasma etching chamber, all at appropriate times and in appropriate sequence.

The multilayer 10 structure is then placed within the plasma etching chamber, and etched with a fluorinated chemical etchant system to form a predetermined pattern therein. The fluorinated chemical etchant system of the present invention comprises a chemical etchant composition, such as $CHF_3$, $CF_4$, and Ar, and an additive material. The fluorinated chemical etchant system is in a substantially gaseous phase during the etching of the multilayer structure 10.

In the case of the chemical etchant composition including $CHF_3$, $CF_4$ and Ar, and an additive material comprising $CH_2F_2$, the exposed $SiO_2$ layer 14 is selectively etched at a relatively high etch rate and high selectivity down to the $Si_3N_4$ etch "stop" layer 16. Predetermined portions of the $SiO_2$ layer 14 are removed using chemically enhanced ionic bombardment of the gas phase etchant material.

An inert gas, preferably argon (Ar), is added to the etch plasma, as it tends to further enhance the uniformity of the etch process. Argon is preferred because of its weight and commercial availability, but the other inert gases can also be used.

Heating the chamber sidewall and electrode (i.e., the wafer chuck) to higher than normal operating range, according to the present invention, produces an increase in oxide to nitride selectivity, contrary to the current teaching on high selectivity etching.

Heating the separate individual components of the chamber (e.g., sidewalls, chuck, helium backside, etc.) produced varying degrees of positive results when there was an overall increase in temperature.

Current process temperatures for highly selective etches include maintaining the etch chamber sidewalls at approximately 50° C., and the lower electrode at approximately 20° C. or below, and a helium backside pressure in the approximate range of 4.0–12.0 torr.

In contrast, the preferred embodiment of the present invention involves increasing the temperature of the chamber sidewalls to a temperature in the approximate range of 50° C.–100° C., and the temperature of the lower electrode is in the approximate range of 30° C.–100° C., and preferably in the range of 30° C.–70° C. The helium backside cooling apparatus is maintained at a pressure in the approximate range of 4.0 torr or less. Decreasing the pressure of the helium backside cooling apparatus, essentially translates to increasing the temperature.

The reaction chamber can be heated via a fluid system, in which a fluid, such as, for example, water, at a desired temperature is flowed around the chamber walls. Alternatively, a gas can be flowed to heat the system.

However, temperature increases in the lid or anode has produced negative results. Therefore, it is critical that the right combination of higher temperatures be maintained to produce the best selectivity. If the anode is increased to a temperature over 90° C., the photoresist layer 12 will begin to burn and reticulate. This upper temperature limitation is governed by the masking material and should not be viewed as a hard limit.

It is believed that increasing the temperature, also increases the rate of generation of the particular polymer species, and consequently is responsible for the increase in oxide to nitride selectivity. By increasing the temperature of the chamber, chuck, and sidewall, the selectivity is increased. Further, as the backside helium cooling was reduced, (in effect heating the wafer), the selectivity also increased.

The use of temperature control in the present invention further helps to minimize polymer build-up on the surfaces of the reaction chamber. Limiting polymer build-up substantially decreases possible contaminants, as well as downtime of the apparatus for cleaning.

Representative etch parameters were employed in the process for etching a multilayer structure 10 of the present invention. One having ordinary skill in the art will realize that the above values will vary depending on the make and model of the etcher used in the process.

The flow rates of the component gases, based on the total gas flow of the fluorinated chemical etchant system, used herein was as follows: an etchant comprised of 16% CF4, 60% Ar, 9% CH2F2, and 13% CHF3, at a total pressure in the system of 225 mTorr, magnetic field maintained at 75 gauss, and RF power applied at 425 watts.

The parameters of the present invention are within the following approximate ranges: an etchant material comprised of 14 sccm CH2F2, 25 sccm CF4, 90 sccm AR, and 20 sccm CHF3, at a total pressure in the system of 225 mTorr magnetic field maintained at 75 gauss, and RF power applied at 425 watts.

Silicon dioxide and silicon nitride layers, 14 and 16 respectively, were patterned with etch masks 12 having the appropriate etch mask openings 12a and geometries. The wafers were then etched, thereby creating a substantially vertical profile in the respective films.

Figure 4A:
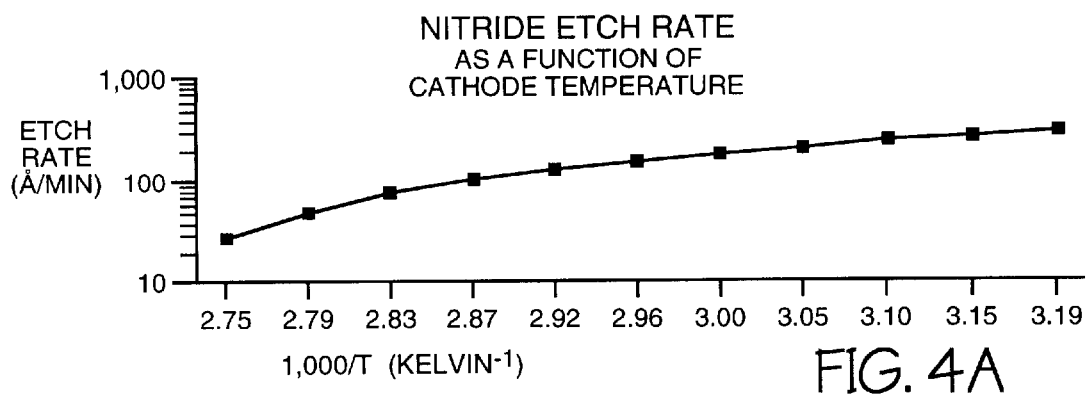
FIGS. 4a–4c are Arrhenius plots illustrating the unexpected results obtained with the process of the present invention.
Figure 4B:
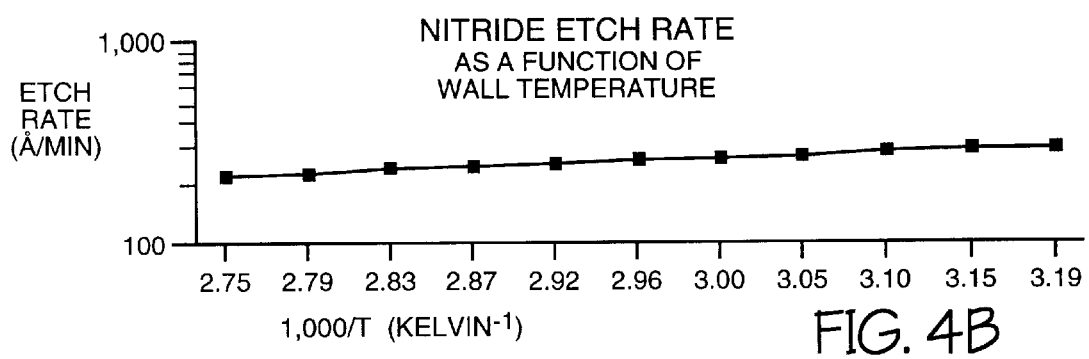
Figure 4C:
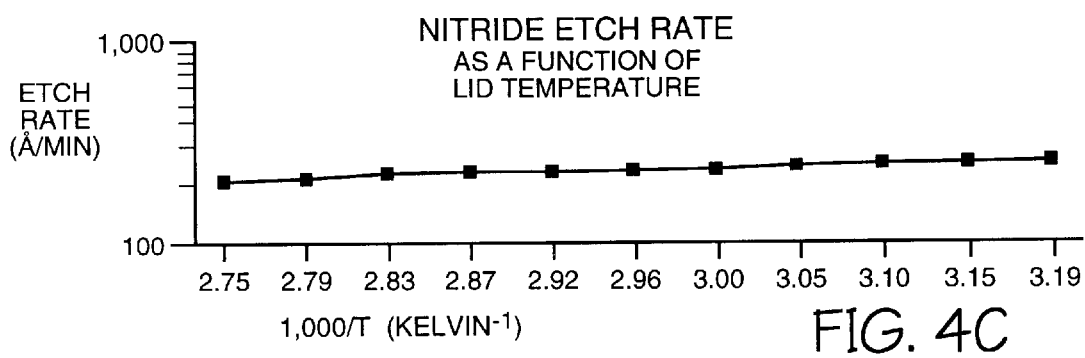

FIGS. 4a, 4b, and 4c illustrate the etch selectivities which were obtained using the process of the present invention. FIG. 4a depicts the positive slope obtained on an Arrhenius plot, which slope indicates that the nitride etch rate decreases as a function of increased electrode temperature.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the present invention is also useful in etching an oxide/nitride/oxide (ONO) stack.

What is claimed is:

1. A method of selectively etching a layered structure, comprising steps of:
   providing a first, etch stop, material layer comprising silicon nitride;
   providing a layer of a second, different material over at least a portion of said first material layer;
   etching a portion of said second, different material layer selectively to said first material with a fluorinated plasma to expose a portion of said first material; and
   maintaining said layered structure above a temperature of at least 30 degrees C. during said step of etching.

2. A method according to claim 1, wherein said fluorinated plasma comprises at least one of the group consisting essentially of $CF_4$, $CH_2F_2$, and $CHF_3$.

3. A method according to claim 2, wherein said fluorinated plasma further comprises Ar.

4. A method according to claim 2, wherein said step of etching exposes said layered substrate to said fluorinated plasma within a magnetically enhanced etching chamber.

5. A method according to claim 1, wherein said second material comprises one of the group consisting essentially of undoped silicon oxide and doped silicon oxide.

6. A method according to claim 1, wherein said step of etching comprises exposing said layered substrate to said fluorinated plasma within a magnetically enhanced etching chamber.

7. A method according to claim 1, further comprising:
   providing an etchant protective layer over said layer of second material, said protective layer defining openings by which to pattern said layer of second material during said step of etching.

8. A method of plasma processing a layered substrate, comprising:
   providing a layered substrate comprising silicon nitride having a layer of a second, different material over at least a portion thereof;
   providing a plasma processing chamber having an upper electrode and a lower electrode;
   seating the layered substrate upon the lower electrode;
   providing a fluorinated plasma within said plasma processing chamber while maintaining the lower electrode at a temperature of at least 30 degrees C. to selectively etch a portion of said layer of second, different material to said silicon nitride as an etch stop.

9. A method according to claim 8, wherein said second material comprises at least one of the group consisting essentially of doped and undoped silicon dioxide.

10. A method according to claim 8, wherein said providing, said plasma processing chamber comprises providing a magnetically enhanced plasma processing chamber.

11. A method according to claim 8, wherein said fluorinated plasma comprises at least one of the group consisting essentially of $CF_4$, $CH_2F_2$, and $CHF_3$.

12. A method according to claim 11, wherein said flourinated plasma further cinoruses Ar.

13. A method according to claim 11, wherein said plasma processing chamber comprises a magentically enhanced plasma processing chamber.

14. A method according to claim 8, further comprising a step of providing an etch mask over said layer of second, different material, said etch mask having a pattern of openings through which said selective etching is effected.

15. A method of dry etching a semiconductor wafer, comprising steps of:
   providing a semiconductor wafer having a silicon nitride layer and a silicon oxide layer disposed over the silicon nitride layer;
   plasma etching a portion of the silicon oxide layer to expose a portion of the silicon nitride layer; and
   providing said semiconductor wafer a temperature of about at least 30 degrees C. during said step of plasma etching.

16. A method according to claim 15, wherein said step of plasma etching employs at least one of the group consisting essentially of $CF_4$, $CH_2F_2$, $CHF_3$.

17. A method according to claim 15, wherein the silicon oxide comprises at least one of the group consisting essentially of doped silicon oxide and undoped silicon oxide.

18. A method according to claim 15, wherein said step of plasma etching is performed within a magnetically enhanced plasma processing chamber.

19. A method according to claim 15, wherein said semiconductor wafer further comprises an etchant protective layer disposed over the silicon oxide layer, said protective layer having a predefined pattern of openings through which to etch corresponding said portion of the silicon oxide layer during said step of plasma etching.

20. A method according to claim 15, further comprising:

providing a plasma processing chamber having an upper electrode and a lower electrode for seating a wafer;

seating said semiconductor wafer upon said lower electrode within the plasma processing chamber; and controlling a temperature of said lower electrode to establish said temperature of said semiconductor wafer during said step of plasma etching.

21. A method of selectively etching a layered structure, comprising steps of:

providing an etch stop material layer comprising silicon nitride;

providing a layer of silicon oxide over at least a portion of said silicon nitride;

employing a fluorinated plasma and etching a portion of said layer of silicon oxide more favorably relative to said silicon nitride to expose a region of said silicon nitride; and maintaining said layered structure above 30 degrees C. during said step of etching.

22. A method of plasma processing a layered substrate, comprising:

providing a layered substrate comprising silicon nitride having a layer of a second, different material over at least a portion thereof;

providing a plasma processing chamber having an upper electrode and a lower electrode;

seating the layered substrate upon the lower electrode;

providing a fluorinated plasma within said plasma processing chamber while maintaining the lower electrode at a temperature of at least 30 degrees C. to etch a portion of said layer of second material more favorably relative to said silicon nitride as an etch stop.

23. A method of etching a plurality of apertures in a multilayered structure, comprising:

providing a layer of silicon nitride having a layer of silicon dioxide over at least a portion thereof;

providing an etchant protective layer over at least a portion of the silicon dioxide layer, the etchant protective layer defining a plurality of apertures therethrough; and etching the silicon dioxide with a fluorinated plasma through the plurality of apertures to respective etch stop regions on the silicon nitride layer while maintaining the multilayered structure above a temperature of at least about 30 degrees C.

24. A method according to claim 1, wherein said second material comprises silicon oxide.

* * * * *

UNITED STATES PATENT AND TRADEMARK OFFICE
CERTIFICATE OF CORRECTION

PATENT NO : 6,015,760
DATED : Jan. 18, 2000
INVENTOR(S): David S. Becker, Guy T. Blalock, Fred L. Roe It is certified that error appears in the above-identified patent and that said Letters Patent is hereby corrected as shown below:

at column 5, lines 17-18, correct the phrase "with the addition of 10 sccm", by substituting therefor -- with the addition of 10 sccm $CH_2F_2$. --.

In the claims, correct claim 12 as follows:

12. A method according to claim 11, wherein said flourinated plasma further [cinoruses] comprises Ar.

Signed and Sealed this

First Day of May, 2001

Attest:

NICHOLAS P. GODICI

Attesting Officer    Acting Director of the United States Patent and Trademark Office